June 2, 1964　　E. O. SCHOENIKE　　3,135,934

VARIABLE REACTANCE ATTENUATION NETWORK
CONTROLLED BY CONTROL VOLTAGE
Filed March 8, 1961

INVENTOR.
EDGAR O. SCHOENIKE
BY Moody & Anderson
AGENTS

United States Patent Office 3,135,934

Patented June 2, 1964

3,135,934

VARIABLE REACTANCE ATTENUATION NETWORK CONTROLLED BY CONTROL VOLTAGE

Edgar O. Schoenike, Cedar Rapids, Iowa, assignor to Collins Radio Company, Cedar Rapids, Iowa, a corporation of Iowa Filed Mar. 8, 1961, Ser. No. 94,182

4 Claims. (Cl. 333—81)

Figure 1:
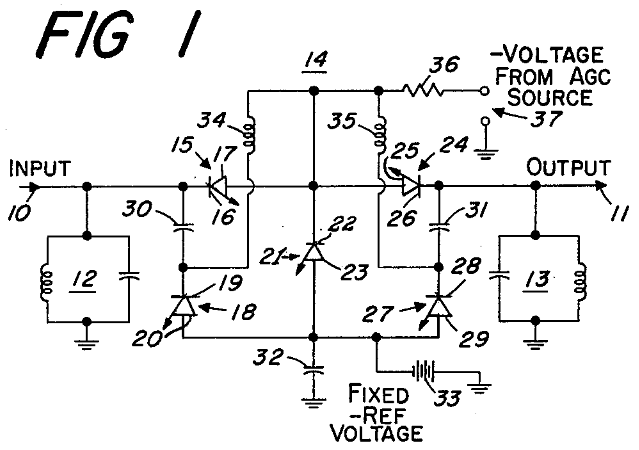

This invention relates generally to coupling devices and more particularly to a symmetrical variable capacitance network which, in response to a variable direct-current voltage control source, provides a variable attenuation between input and output terminals thereof.

The device of the present invention may, for example, be responsive to an A.G.C. control voltage to provide variable attenuation between coupled circuits and thus function as a passive A.G.C. circuit.

Conventional A.G.C. circuits operating by controlling the gain of an amplifier are well known in the art. Certain signal translating devices requiring automatic gain control may not be particularly adaptable to conventional A.G.C., since the control of the gain of an amplifying stage or stages by the conventional variation in bias as a function of the output signal level may seriously impair the signal handling capabilities of the amplifier. The conventional control of the amplifier gain in A.G.C. circuitry introduces a certain amount of distortion since the control by its nature varies the operating point of the amplifier stage and the dynamic range of control is thereby necessarily limited.

The attainment of automatic gain control by means other than the above conventional method have been realized by so called passive A.G.C. circuits in which the coupling between successive stages is varied to provide a variable attenuation characteristic as a function of the output voltage level. Patent No. 2,183,632 to Wilhelm discloses one such method in which capacitively coupled stages employ a capacity which is controlled in accordance with a direct potential applied thereto. Wilhelm employs a condenser having two plates and an intermediate foil in an arrangement such that the coupling capacitance is variable in accordance with a direct-current voltage source but, due to differential action in the particular capacitor utilized, the over-all capacitance does not vary and detuning of associated oscillatory circuit is prevented.

The present invention utilizes the voltage-sensitive junction capacitance characteristic of semi-conductor diodes as variable capacitance in a coupling circuit. The semi-conductor devices are of the type comprising a p-n function which when forwarded biased (positive to the p-type material and negative to the n-type material) permits passage of current and when reverse biased (negative to the p-type material and positive to the n-type material) blocks the flow of current with the junction exhibiting capacitance as an inverse function of the reverse bias. Such devices are known, and may be, for example, those described in an article entitled "Semiconductor Variable Capacitors," by H. R. Smith, in the December 1958 issue of Radio and T.V. News magazine, wherein such devices are defined as commercially available Varicaps and Semicaps. Because of the diode characteristic of these devices, hereinafter to be referred to as "voltage variable capacitors," they may be described as being "polarized" in the sense that a diode is polarized. The device will thus hereinafter be described as including a "cathode" and "anode" in the sense that a diode possesses such elements.

It is an object of the present invention to provide a voltage controlled capacitance network of an improved type utilizing voltage variable capacitors to introduce a variable attenuation coupling between two coupled circuits as a function of a direct-current control voltage in which a unique "double action" is realized to provide a large dynamic range of attenuation control with a minimum of controlled elements.

A further object of the present invention is the provision of a balanced capacitive coupling network which may be serially inserted in a signal translating path to provide a variable attenuation characteristic and which includes a differential control whereby the shunting capacitance remains relatively constant over the operating range.

Invention is feature in the provision of a balanced-T type of coupling network in which an increased series reactance is simultaneously accompanied by a decreasing shunt reactance to introduce a proportionally greater over-all attenuation in response to the control voltage source.

Figure 2:
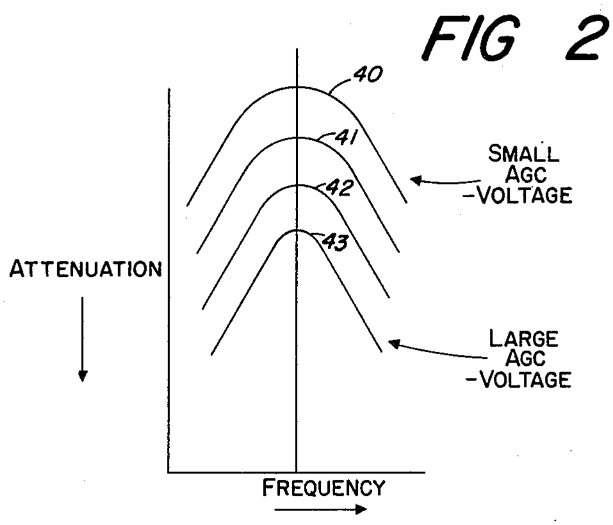

These and other features and objects of the present invention will become apparent upon reading the following description with reference to the accompanying drawing, in which:

FIGURE 1 is a schematic diagram of the embodiment of the invention as symmetrically employed between two tuned circuits; and FIGURE 2 is a diagrammatic representation of the attenuation characteristic as a function of input signal frequency for various applications of control voltage.

FIGURE 1 illustrates the variable capacitance coupling network (generally designated by reference numeral 14) as employed between an input tuned circuit 12 and an output tuned circuit 13. The coupling network basically consists of a T-arrangement of three voltage variable capacitors 15, 24, and 21. The voltage variable capacitors are illustrated in FIGURE 1 as a composite representation including two plates for a capacitor, an arrow to indicate variability and the convention diode symbol in the background to represent the diode polarization characteristics. In diode terminology the "anode electrode" is hereinafter described as that into which current flows in diode convention and the "cathode electrode" as that from which current flows in diode convention. Voltage variable capacitors 15 and 24 are serially connected between input terminal 10 and output terminal 11 respectively. Input terminal 10 is connected to the cathode electrode 16 of member 15 and output terminal 11 is connected to the cathode electrode 26 of member 24. Voltage variable capacitor 23 is connected between the anodes 17 and 25 of members 15 and 24 and a fixed negative reference voltage 33. The anodes of voltage variable capacitors 15 and 24 are connected through a resistor 36 to a source of variable negative A.G.C. voltage 37. The A.G.C. voltage source 37 is applied through resistor 36 and choke 34 to the cathode electrode 19 of a voltage controlled capacitor 18, the anode 20 of which is connected to the negative reference voltage source 33. Similarly, the A.G.C. source 37 is connected through resistor 36 and choke 35 to the cathode electrode 28 of voltage variable capacitor 27, the anode 29 of which is connected to the negative reference voltage source 33. A first signal coupling capacitor 30 is connected between the input terminal 10 and the cathode electrode 19 of member 18. A second signal coupling capacitor 31 is connected between the output terminal 11 and the cathode electrode 28 of member 27. A third coupling capacitor 32 couples the anodes of voltage controlled capacitors 18, 21, and 27 to common ground. Each of the input and output tuned circuits 12 and 13 is referenced to common ground.

Each of the voltage controlled capacitors in FIGURE 1 is reverse biased such that its capacitance varies inversely as a function of the reverse bias voltage in a known manner. The negative A.G.C. source voltage is directly applied as reverse bias across the series voltage variable capacitors 15 and 24. The anodes 17 and 25 of these members are thus maintained negative with respect to their cathodes 16 and 26 due to the common ground return for the A.G.C. source 37 and the tuned circuits 12 and 13. The shunt member 21 of the coupling network has its cathode 22 connected to the negative A.G.C. source 37 and its anode 23 connected to the fixed negative reference voltage 33. The fixed reference voltage 33 therefore is chosen to exceed in magnitude the maximum negative voltage from A.G.C. source 37 such that throughout the operating range, member 21 is reverse biased. The reverse bias on member 21 is therefore the difference between fixed reference 33 and the A.G.C. source 37 and an increase in A.G.C. source voltage (greater negative) reduces the reverse bias on shunt member 21 by the same amount that the directly applied A.G.C. source 37 increases the bias on series members 15 and 24.

The relationship between reverse bias and capacitance of the voltage variable elements may be expressed generally as $$C=\frac{K}{V^n}$$

where K and $n$ are constants and $n$ might be one-half, for example. The capacitance of such an element therefore might be said to vary inversely as the square root of the reverse bias voltage and an increase in reverse bias voltage therefore decreases the capacitance. Thus, an increase in the negative A.G.C. voltage results in an increase in the reverse bias on series capacitors 15 and 24 and a corresponding decrease in the reverse bias on the shunt member 21.

A double attenuation effect is realized with increasing A.G.C. voltage since the series capacitive members 15 and 24 decrease in value to present a higher series impedance path between the input and output terminals while the shunt capacitive member 21 increases in value to provide a simultaneous decrease in the shunting impedance path. These actions are cumulative in increasing the attenuation of an input signal frequency to input terminal 10. The differential action of series capacitive member 15 and shunt member 21 serves to keep relatively constant the over-all shunting capacitance of the coupling network 14 with regard to the input and output tuned circuits 12 and 13. The over-all shunting capacitance might be considered, for example, to be the resultant capacitance of members 15 and 21 serially connected across the input tuned circuit 12. A decrease in the capacitance of member 15 is counteracted by a simultaneous increase in the capacitance of member 21. The shunt member 21 is doubly advantageous as concerns its inclusion in the coupling network. The shunt member 21 tends to maintain the over-all shunting capacitance of network 14 as concerns the turned circuits 12 and 13 relatively constant so as to prevent a shift in the tuned frequency of the over-all circuit, and additionally the shunt member serves to bypass more and more signal-to-ground as the series members 15 and 24 decrease in capacitance to add to the attenuation effect.

Since the shunting capacitance that the network 14 introduces might be considered that of two capacitances in series, the resultant shunting capacitance is not constant as the two members vary differentially; but is progressively lessened as the A.G.C. voltage is increased. Voltage variable capacitors 18 and 27 are therefore introduced into the network 14 to compensate for the variation in shunt capacitance and are seen to be reverse biased in the same manner as shunt member 21. An increase in A.G.C. voltage decreases the reverse bias of compensating members 18 and 27 such that their capacitance increases. The compensating members 18 and 27 effectively shunt the tuned circuits 12 and 13 and their increase in capacitance with increased A.G.C. voltage compensates for the decreasing capacitive effect of the capacitive shunt formed by members 15 and 21 or members 24 and 21 with regards to tuned circuits 12 and 13 respectively.

Coupling capacitors 30, 31 and 32 serve as direct-current blocking capacitors in the coupling network and, at the operating signal frequency, present effectively zero signal impedance. Choke members 34 and 35 are included to block signal frequencies from the A.G.C. source.

The attenuation of the frequency band determined by turned circuits 12 and 13 is shown graphically in FIGURE 2. Curves 40, 41, 42, and 43 illustrate the passband characteristic with increasingly larger values of A.G.C. voltage. It is seen that the attenuation increases with the larger A.G.C. voltages while the center frequency of the passband remains constant. The decrease in series capacitive members 15 and 24 with larger A.G.C. voltages taken cumulatively with the corresponding increases in the shunt capacitance of members 18, 21, and 27 results in a considerable variation in attenuation of the frequency passband with changes in A.G.C. voltage. Since the shunt capacitive members introduced a compensating effect to keep the over-all shunt capacitance at a nearly constant value, the resonant frequency of the system of FIGURE 1 is not altered and thus the peaks of the attenuation curve remain advantageously at the fixed operating center frequency.

The differential capacitor action is seen to be realized by variation of the series impedance path directly with A.G.C. voltage and a variation of the shunt paths in the coupling network in an inverse fashion by returning the anodes of the shunt capacitive members to a fixed reference potential which by definition exceeds the maximum A.G.C. voltage. It is to be realized that the incorporation of voltage variable capacitive elements necessitates that all such elements are at all times reverse biased. It follows therefore that the fixed reference voltage in FIGURE 1 must be of such a magnitude that it, at all times, exceeds the A.G.C. voltage and further it becomes apparent that the A.G.C. voltage should not exceed predetermined extremes so that the reverse bias of the capacitive members will always be of sufficient magnitude to prevent the input signal voltage peaks from exceeding the A.G.C. voltage. In the embodiment illustrated, the fixed reference voltage might be −20 volts, the maximum negative A.G.C. voltage −18 volts and the minimum A.G.C. negative voltage −2 volts. With this operating range, the coupling network may handle input signal peaks up to two volts and properly maintain each of the capacitive elements in the necessary reverse biased condition.

The above discussed embodiment of the invention produces a variable attenuation coupling network responsive to a variable negative A.G.C. or other control voltage source. The symmetrical arrangement is readily adaptable for control from a variable positive voltage source and the embodiment of FIGURE 1 is readily adaptable to either positive or negative voltage control. For operation with a variable positive A.G.C. source, a positive fixed reference voltage would be employed and each of the voltage controlled rectifiers 15, 24, 21, 18, and 27 would be reverse polarized from that illustrated in FIGURE 1. With reversal of polarity of the fixed variable voltage sources and reverse polarization of the voltage variable capacitive elements, the elements are properly reverse biased and the differential capacitance variation between the series and shunt capacitive members is similarly maintained with the cathode electrodes of the capacitive elements being maintained positive with respect to their anodes with no change in the operational characteristics. It is to be realized that in either operational mode, the fixed reference voltage and variable control voltage are like-polarized with respect to the common ground reference and the magnitude of the fixed reference voltage must exceed the maximum magnitude of the variable voltage source. The coupling network is thus seen to be readily applicable to provide attenuation between the input and output terminals as a direct function of the variable voltage source and is equally adaptable for control from either a positive or negative control voltage.

Further design considerations for a particular embodiment would involve a choice of reverse bias voltages on the capacitive elements at minimum A.G.C. voltage such that the resulting coupling network is critically coupled. It may be seen that the choice of bias voltages might be disadvantageously chosen such that a decreasing A.G.C. voltage might result in capacitances in the network 14 which produce an overcoupled network. It is desirable that the coupling not exceed the critical coupling in order that throughout the frequency passband a constantly increased attenuation is realized for increasing A.G.C. voltages over the operating range.

The invention is thus seen to provide a novel voltage variable attenuation network which may be utilized with tuned circuits without affecting the resonant frequency thereof.

The coupling network because of its passive nature and differential control of reactance is particularly suitable for usage as an automatic gain control arrangement in applications where the signal handling capabilities of amplification stages is not to be impaired. The circuit offers distortionless automatic gain control and is particularly adaptable for inclusion in transistorized circuitry wherein heretofore somewhat elaborate precautions have been included in automatic gain control design due to the inability of transistorized amplifiers to retain their signal handling capabilities with conventional bias control techniques.

Although the invention has been described with respect to a particular embodiment thereof, it is not to be so limited as changes might be made therein which fall within the scope of the invention as defined in the appended claims.

I claim:

1. A variable attenuation coupling network comprising an input terminal and an output terminal, a common reference terminal, first and second voltage variable capacitive elements serially connected with opposite polarization between said input and output terminals, a third voltage variable capacitive element connected between the junction of said first and second capacitive elements and a common junction, a signal coupling capacitor connected between said common reference terminal and said common junction, a source of variable direct-current voltage operably connected across each of said first and second voltage variable capacitive elements, said variable direct-current voltage being of a predetermined polarization to effect reverse biasing of said first and second voltage variable capacitive elements, means including a fixed reference direct-current voltage source and said variable direct-current voltage source operably connected across said third voltage variable capacitive element for effecting a reverse bias of said third capacitive element as an inverse function of the magnitude of said variable direct-current voltage source, fourth and fifth voltage variable capacitive elements with first electrodes thereof connected to said common junction and being like-polarized with said third voltage variable capacitive element with respect to said common junction, second electrodes of said fourth and fifth capacitive elements connected through second and third coupling capacitors to said input and output terminals respectively, the junctions between said fourth and fifth capacitive elements and second and third coupling capacitors connected through first and second signal frequency blocking elements to the junction between said first and second voltage variable capacitive elements.

2. A variable attenuation coupling network as defined in claim 1 wherein said variable direct-current voltage source and said fixed reference direct-current voltage source are respectively referenced to said common reference terminal, each of said direct-current voltage sources being like-polarized with respect to said common reference terminal, said variable direct-current voltage source including a maximum output voltage, said fixed reference direct-current voltage source exceeding the maximum output voltage of said variable voltage source by a predetermined magnitude, said input and output terminals being connected respectively through input and output loads each of which includes a direct-current voltage path to said common reference terminal whereby said variable voltage source is directly impressed across said first and second capacitive elements and the difference voltage between said reference and variable direct-current voltage sources is impressed across said third capacitive element, said third capacitive element being so polarized as to be reverse biased by said reference voltage.

3. A voltage variable signal attenuation network comprising first, second, and third voltage variable capacitance elements each having at least first and second electrodes, input and output terminals respectively connected to first electrodes of said first and second capacitance elements, the second electrodes of said first and second capacitance elements connected in common with the first electrode of said third capacitance element, a direct-current blocking capacitor, the second electrode of said third capacitance element connected through said blocking capacitor to a common reference terminal, a variable direct-current voltage source connected between the junction of said first and second capacitance elements and said common reference terminal, said variable voltage source being variable over a predetermined range including a maximum voltage, a fixed direct-current voltage source connected from the junction between said third capacitance element and said direct-current blocking capacitor to said common reference terminal, said fixed reference voltage source having a magnitude exceeding the predetermined maximum voltage of said variable voltage source, each of said variable and fixed voltage sources being like-polarized with respect to said common reference terminal and of a predetermined polarization effecting a reverse bias of each of said first, second, and third capacitance elements, means for applying an input signal between said input and common reference terminals and output means connected between said output and common reference terminals.

4. A voltage variable signal attenuation network as defined in claim 3 further comprising fourth and fifth voltage variable capacitance elements each having first and second electrodes with the first electrodes thereof connected through signal frequency blocking means to said variable voltage source and second electrodes thereof respectively connected to said fixed voltage source, and second and third direct-current blocking capacitors connected respectively between said input and output terminals and the first electrodes of said fourth and fifth voltage variable capacitance elements.

References Cited in the file of this patent

UNITED STATES PATENTS

| | | |
|---|---|---|
| 2,075,957 | Payne | Apr. 6, 1937 |
| 2,191,315 | Guanella | Feb. 20, 1940 |
| 2,243,921 | Rust | June 3, 1941 |
| 2,964,646 | Helms | Dec. 13, 1960 |

OTHER REFERENCES

"Semiconductor Variable Capacitors," by H. R. Smith, pages 46, 47 and 122 of radio and T.V. News magazine, December 1958.